United States Patent
Raghavan et al.

(10) Patent No.: US 9,659,604 B1
(45) Date of Patent: May 23, 2017

(54) DUAL-BIT 3-T HIGH DENSITY MTPROM ARRAY

(71) Applicant: GLOBALFOUNDRIES INC., Grand Cayman (KY)

(72) Inventors: Ramesh Raghavan, Narsingi (IN); Balaji Jayaraman, Bangalore (IN); Janakiraman Viraraghavan, Bangalore (IN); Thejas Kempanna, Bangalore (IN); Rajesh Reddy Tummuru, Bangalore (IN); Toshiaki Kirihata, Poughkeepsie, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/961,484

(22) Filed: Dec. 7, 2015

(51) Int. Cl.
| | |
|---|---|
| G11C 11/56 | (2006.01) |
| G11C 7/06 | (2006.01) |
| G11C 7/12 | (2006.01) |
| G11C 7/18 | (2006.01) |
| G11C 5/14 | (2006.01) |

(52) U.S. Cl.
CPC .............. G11C 7/062 (2013.01); G11C 5/147 (2013.01); G11C 7/12 (2013.01); G11C 7/18 (2013.01); G11C 11/5621 (2013.01); G11C 11/5628 (2013.01); G11C 11/5642 (2013.01)

(58) Field of Classification Search
CPC ............ G11C 11/5628; G11C 11/5642; G11C 11/5621
USPC ..... 365/185.03, 189.02, 185.24, 184, 185.33
See application file for complete search history.

(56) References Cited

U.S. PATENT DOCUMENTS

| 8,432,751 B2 | 4/2013 | Hafez et al. | |
|---|---|---|---|
| 2013/0107635 A1* | 5/2013 | Fisch | G11C 16/00 365/185.33 |

* cited by examiner

Primary Examiner — Jason Lappas
(74) Attorney, Agent, or Firm — Scully Scott Murphy and Presser; Frank Digiglio

(57) ABSTRACT

A multi-time programmable memory (MTPM) memory cell and method of operating. Each MTPM bit cell including a first FET transistor and a second FET transistor having a first common connection, and said second FET transistor and a third FET transistor having a second common connection, said first and second connected FET transistors programmable to store a first bit value, and said second FET and said third connected FET transistors programmable to store a second bit value, wherein said first FET transistor exhibits a low threshold voltage value (LVT), said second FET transistor exhibits an elevated threshold voltage value HVT and said third FET transistor exhibits a threshold value LVT lower than HVT. The MTPM cell enables two bits of information to be stored as default bit values like an electrical fuse. To store opposite bit values, the LVT transistors are programmed such that their threshold voltage is higher than that of HVT.

8 Claims, 5 Drawing Sheets

DUAL-BIT 3-T HIGH DENSITY MTPROM ARRAY

FIELD

This disclosure relates generally to electronic circuits such as non-volatile memory circuits of the multi-time programmable (MTP) type, and particularly a MTP memory (MTPM) cell architecture and method of operation.

BACKGROUND

In high density memory systems, a typical non-volatile memory cell may include a metal-oxide semiconductor (MOS) FET transistor having a parameter, e.g., a transistor device threshold voltage, that may be varied for storing a desired information, e.g., by injecting charges into a floating gate or gate oxide. Accordingly, a current sunk by the memory cell in determining biasing states varies depending on the information stored therein. For example, to store information in a typical twin-transistor memory cell there is provided two different threshold voltage values for the cell, with each different threshold voltage value associated with a different logic or bit value.

Existing Twin Cell Multi-Time Programmable (MTP) Memory Architecture utilizes two transistors to store 1 bit of information uses a localized reference transistor per cell. Use of twin cells in an MTP memory open bitline architecture gives the highest density of about 1 Transistor per Bit but suffers from sensing margin problems. The MTP memory open bitline architecture (OBA) (1T cell for 1-bit) further needs a global reference wordline (WL).

FIG. 1A shows an exemplary non-volatile memory CMOS thin-oxide multi-time programmable memory (MTPM) twin cell array structure 10 which may be part of a memory device, or memory system. The MTPM twin cell array structure 10 consists of a plurality of memory cells 11 arranged by 2 dimensional matrix (e.g., m rows and n columns). For simplicity. FIG. 1A shows two columns (columns n="k", n="l") having two rows (m=i, and m=j), each column and row having two memory cells 11, however the actual memory array consists of significantly more cells 11.

Each of the plurality of twin-transistor memory cells 11 includes first and second transistors 15A, 15B for storing a single information bit. They each have a first terminal that are connected with a common node 13, coupling to a source line (SL) running in a grid (both horizontally and vertically) and coupling to other cells in the array 10. In this example, SL could either be coupled to a high voltage (Elevated Source Line (ESL)) or to 0V (Grounded Source Line (GSL)). The other terminal 14 of the first transistor 15A is coupled to the bitline true (e.g., BLkT in column k) and the other terminal 16 of the second transistor 15B is coupled to the bitline complement (e.g., BLkC in column k). Each BLkT and BLkC lines are shown running vertically, and respectively coupled to the twin-cells in same column in the array 10.

The same architecture is shown for the adjacent column "l". Here, each Bitline BLlT and BLlC lines are shown running vertically, and respectively coupled to the twin-cells in its same column in the array 10.

The MTPM array 10 shown in FIG. 1A further includes two gate electrodes 20A, 20B respectively of the respective first and second transistors 15A, 15B which are connected to a common wordline (WL) conductor 50, running horizontally, and coupling to other cells in the same row in the array 10. For example, for row i of array 10, the twin-cell transistor electrodes 20A, 20B connect to Wordline WLi, and for row j, the twin-cell transistor electrodes connect to Wordline WLj.

As shown in FIG. 1, to store a bit value the cell 11 is programmed by increasing the transistor threshold voltage (Vt) of one of the twin transistors 15A and 15B. More specifically, the transistor undergoes a Vt shift when it is programmed. For example, when the 15A transistor is intended to be programmed, it is subjected to a high gate, or WL voltage (e.g., about 2.0 to 2.2V), and high SL voltage (e.g., about 1.5V to 1.8V), the BLT grounded (e.g. BLKt=0V), for a few milliseconds. This induces a Vt shift from its nominal value to a higher value due to BTI (Bias temperature instability) and HCI (hot carrier injection) effects. In this example, a first transistor, e.g., device 15A is shown exhibiting a first threshold voltage (Vt), e.g., its native Vt or initial value, and the second transistor, e.g., device 15B is programmed to exhibit an induced second threshold voltage, e.g., a Vt+shift (added) voltage. However, the VT states of the first and second transistors are interchangeable.

As shown in FIG. 2, the memory cell is configured in a twin-cell architecture similar to FIG. 1, but with two different Vt types (LVT and HVT) for the transistors in the twin-cell. This ensures a default state to be built in the cell. To store the opposite bit value, the transistor with lower Vt (LVT) is programmed so as to raise its Vt higher than that of the HVT transistor. The HVT transistor in this twin-cell acts like a localized reference.

A plurality of memory cells may be interconnected by SLs, BLs and gate lines to form a memory array. The cell selection for read/write is made by turning on the appropriate WL and BL with the voltage levels as shown in FIG. 1B. Thus, each cell pair may be separately programmed to have a Vt shift induced in either the True or the Complement transistor of the twin-cell.

As known, a threshold voltage Vt is the minimum gate voltage that is needed to be applied to turn on a transistor. The transistor undergoes a Vt shift when it is programmed. Typical Vt values may be about 0.25V to 0.3V. When the transistor is subjected to a high gate voltage (e.g., about 2.0 V to 2.2V), and high SL voltage (e.g., ~1.5V-1.8V), with BL grounded, for a few milliseconds (i.e. when it is programmed), its Vt gets shifted from its nominal value to a higher value (e.g., about 0.45 V to 0.5V) due to BTI (Bias temperature instability) and HCI (hot carrier injection) effects.

For a program operation, an input digital data signal Din represents a programmable bit value to be written to the target memory cell 10 by controlling application of a WL voltage, a BLT voltage a BLC voltage, and an SL voltage to the cell transistors 15A, 15B. That is, write circuit drivers may be implemented to generate and apply programming voltages for bitline true (BLT) and bitline complement (BLC) conductors for writing a bit voltage value to the cells 15A, 15B. The target cell is accessed, e.g., via a voltage provided on the wordline WL 50 corresponding to a row of the memory cell, and bit cell voltage values are written to the T or C cell by applying appropriate voltages to the BLT and BLC terminals corresponding to a selected column (complementary lines) of the target memory cell 10. For example the target multi-time programmable bit cell programming voltages generated are applied to WL, BLT, SL and BLC.

When no WL signal is applied, or the voltage applied to WL is 0V, the MOS transistors 15A, 15B do not conduct, resulting in retaining their programmed states. Combinations of voltages can be applied to the first terminal, second terminal and gate terminals of the memory cell 10 to program, inhibit program, read and erase the logic state stored by the MOS transistors.

FIG. 1B shows a chart 35 explaining different modes of operation of the multi-time programmable memory array 10 of FIG. 1A including example voltages at the terminals of the cell transistors 15A, 15B that provide cell states including stand-by, write (program), read and erase (reset) operatons.

These are: 1) a standby state when respective BLT and BLC terminals 14, 16 are floating with a wordline WL of 0.0 Volts applied to the gates of each transistor in the twin-cell 15B, 15A; 2) a write state, e.g., when the respective BLT terminal 14 is at 0 Volts and BLC terminal 16 is at about 1.7 Volts with a wordline WL of about 2.2 Volts applied to the gates of each transistor 15B, 15A and SL voltage of 1.7V; however, the voltages on BLT and BLC could be swapped to store a different logic value in the cell; 3) a read state when each respective BLT terminal and BLC terminal voltage values are such that a voltage delta between BLT and BLC proportional to the Vt shift in the cell is produced, and a wordline WL of 1.0 Volt (VDD) is applied to the gates of each transistor 15B, 15A in the twin-cell and SL of 1V is applied; and 4) an erase state, e.g., when the respective BLT terminal 14 is at 1.7 Volts and BLC terminal 16 is at 0.0 Volts with a wordline WL of −1.0 Volts applied to the gates of each complementary transistor 15B, 15A, as shown in FIG. 1A and FIG. 1B.

Referring to FIG. 1A, generally, in electronic circuits having such bit memory array 10, a sense amplifier circuit (not shown) is provided for obtaining a stored bit value, i.e., perform a memory read operation. Typically, the sense amplifier senses whether the T (true) or C (complement) transistor is programmed (Vt shifted). Such sense amplifier circuit reads a selected bit cell BLT voltage and BLC voltage value at respective BLT terminal 14 and BLC terminal 16 conductors for cells selected by an applied WL voltage, and as selected by a respective corresponding column select transistors (not shown) to select the corresponding target cell via a corresponding select signal and/or a select signal for complementary signals. The column select signals are the same for one pair of BLT and BLC conductors.

In the read operation, the differential voltage between BLT and BLC is amplified to appropriate logic levels using a sense amplifier. For example, the read state of about 0.5 volts (500 mV) for BLC (15A native state, or no Vt shift state) and the read state of about 0.3 volts (300 mV) for BLT (15B programmed state, or Vt shift state). This results in a 0.2V (200 mV) differential voltage built between BLT and BLC are shown in FIG. 1B at 36 for the sensing of BLT programmed state.

The use of a twin-transistor cell for storing a single information bit, shown in FIG. 1A has been proposed for non-volatile memories to reduce sensitivity to device variation.

For non-volatile twin cell memories which have write and effective erase conditions, multiple write cycles is easily achieved.

However, it would be highly desirable to provide a memory cell solution that improves the density of such non-volatile memory.

SUMMARY

In one aspect, the present invention proposes a memory cell architecture having three connected transistors for storing 2 bits of information.

In one aspect, there is provided a multi-time programmable bit cell comprising: a first FET transistor and a second FET transistor having a first common connection, and said second FET transistor and a third FET transistor having a second common connection, said first and second connected FET transistors programmable to store a first bit value, and said second FET transistor and said third connected FET transistors programmable to store a second bit value, wherein said first FET transistor exhibits a native threshold turn-on value (LVT), said second FET transistor is biased with an elevated threshold voltage value HVT and said third FET transistor exhibits a native threshold value LVT lower than HVT.

In a further aspect, there is provided a method of operating a multi-time programmable (MTP) bit cell. The method comprises: selecting a MTP bit cell to write an initial bit value for storage at the selected bit cell, the MTP bit memory cell comprising: a first FET transistor and a second FET transistor having a first common connection, and the second FET transistor and a third FET transistor having a second common connection, the first and second connected FET transistors programmable to store a first bit value, and the second FET and the third connected FET transistors programmable to store a second bit value, wherein the first FET transistor exhibits a low threshold voltage (LVT), the second FET transistor exhibits an elevated threshold voltage value (HVT) and the third FET transistor exhibits a low threshold value LVT lower than HVT, wherein, a first terminal of the first FET transistor connects with a first bit line (True) conductor coupled via a first column write switch device, a second terminal of the third FET transistor connects with a second bit line (True) conductor coupled via a fourth column write switch device; the second common connection is formed of a connection between a second terminal of the second FET transistor and a first terminal of the third FET transistor, a third switch device for selectively connecting the second common connection to a first complement bitline conductor; and the first common connection is formed of a connection between a second terminal of the first FET transistor and a first terminal of the second FET transistor, and a second switch device for selectively connecting the first common connection to a second complement bitline conductor; and a further switch device for selectively connecting the second common connection to a supply voltage source via a first source line (SL) conductor, the supply voltage source for biasing the second common connection when writing to the first storage bit in the first FET transistor and second FET transistor; and writing a first bit of information for storage at the first FET transistor and second FET transistors of the selected MTP cell by: activating the further switch for biasing the second common connection using the SL supply voltage source; and activating a program switch device for switching connection of a program bit voltage supply on the first bit line (True) conductor while the first column write switch device de-activated; and applying at the first bit line (True) conductor, using the program bit voltage supply, a program voltage to the first FET transistor and second FET transistor devices for storage of a bit value thereat.

In a further aspect, there is provided a memory cell array. The array comprises: a plurality of multi-time programmable (MTP) bit memory cells, each MTP bit cell comprising: a first FET transistor and a second FET transistor having a first common connection, and said second FET transistor and a third FET transistor having a second common connection, said first and second connected FET transistors programmable to store a first bit value, and said second FET and said third connected FET transistors programmable to store a second bit value, wherein said first FET transistor exhibits a low threshold voltage value (LVT), said second FET transistor exhibits an elevated threshold voltage value (HVT) and said third FET transistor exhibits a low threshold value LVT lower than HVT.

Further to this aspect, in the MTP bit cell array, each of the first, second and third FET transistors of each the MTP bit memory cell includes a respective gate terminal for connection with a wordline conductor element configured for activating the cell, and each cell of the array further comprises: a first terminal of the first FET transistor connecting with a first bit line (True) conductor coupled via a first column write switch device, a second terminal of the third FET transistor connecting with a second bit line (True) conductor coupled via a fourth column write switch device, wherein: the second common connection is formed of a connection between a second terminal of the second FET transistor and a first terminal of the third FET transistor, a third switch device for selectively connecting the second common connection to a first complement bitline conductor; and the first common connection is formed of a connection between a second terminal of the first FET transistor and a first terminal of the second FET transistor, and a second switch device for selectively connecting the first common connection to a second complement bitline conductor.

Further to this aspect, in the MTP bit cell array, each the first switch, second switch, third switch and fourth switch provide a respective switched connection to a sense amplifier for sensing bit values of the bit cell, the first switch and third switch selectively connecting the first bit line (True) conductor and first complement bitline conductor, respectively, to the sensing amplifier for sensing of a first storage bit of the cell; or the fourth and second switch selectively connects the second bit line (True) conductor the second complement bitline conductor, respectively, to the sensing amplifier for sensing of a second storage bit of the cell.

Moreover, further to the MTP bit cell array, there is provided: a further switch device for selectively connecting the second common connection to a supply voltage source via a first source line (SL) conductor, the supply voltage source for biasing the second common connection when writing to the first storage bit in the first FET transistor and second FET transistor; and a further switch connecting the first common connection to the supply voltage source via a second source line conductor, the supply voltage source for biasing the first common connection when writing to the second storage bit in the second FET transistor and the third FET transistor.

In yet a further aspect, there is provided a memory system. The memory system comprises: a multi-time programmable (MTP) bit cell array, with each multi-time programmable bit cell of the array comprising: a first FET transistor and a second FET transistor having a first common connection, and the second FET Transistor and a third FET transistor having a second common connection, the first and second connected FET transistors programmable to store a first bit value, and the second FET transistor and the third connected FET transistors programmable to store a second bit value, wherein the first FET transistor exhibits a native threshold turn-on value (LVT), the second FET transistor is biased with an elevated threshold voltage value HVT and the third FET transistor exhibits a native threshold value LVT lower than HVT, wherein each MTP bit cell further comprises: a first terminal of the first FET transistor connecting with a first bit line (True) (BLT0) conductor coupled via a first column write switch device; a second terminal of the third FET transistor connecting with a second bit line (True) (BLT1) conductor coupled via a fourth column write switch device; the second common connection formed of a second terminal of the second FET transistor and a first terminal of the third FET transistor, a third switch device for selectively connecting the second common connection to a first complement bitline conductor (BLC0), and a further switch for selectively connecting the second common connection to a supply voltage source via a first source line (SL) conductor; the first common connection formed of a second terminal of the first FET transistor and a first terminal of the second FET transistor, and a second switch device for selectively connecting the first common connection to a second complement bitline conductor (BLC1), and a further switch connecting the first common connection to the supply voltage source via a second source line conductor; a wordline conductor (WL) programmable for activating MTP bit memory cell, each of the first, second and third FET transistors of each the MTP bit memory cell including a respective gate terminal for connection with the wordline conductor (WL) element; a sense amplifier for sensing received voltage values; a multiplexor for selecting one out of many data output signals, the multiplexor responsive to control signals for activating the first switch device and third switch device to enable sensing, by the sensing amplifier, of voltage values representing a first stored information bit on the first bit line (True) conductor and first complement bit line conductor, or responsive to control signals for activating the second switch and fourth switch devices to enable sensing, by the sensing amplifier, of voltage values representing a second stored information bit on the second bit line (True) conductor and second complement bit line conductor.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION

A memory cell architecture having three transistors to store two bits of information.

Figure 1A:
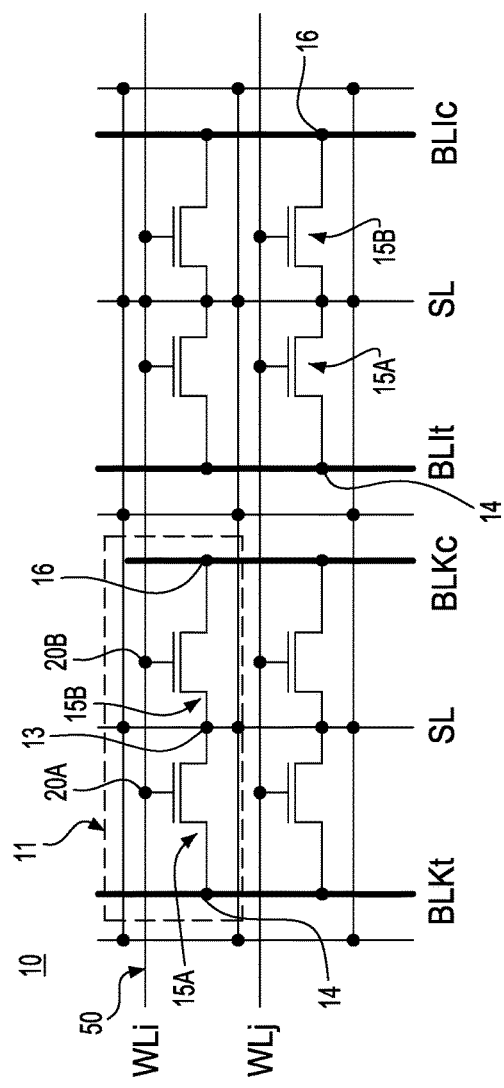
FIG. 1A depicts a multi-time programmable memory array 10 consisting of a twin-transistor memory cell 11, where a source line SL is a separate line coupled to a voltage source as conventionally known.
Figure 1B:
FIG. 1B depicts a chart of the variable modes of operation for the multi-time programmable memory cell 11 of FIG. 1A.
Figure 2:
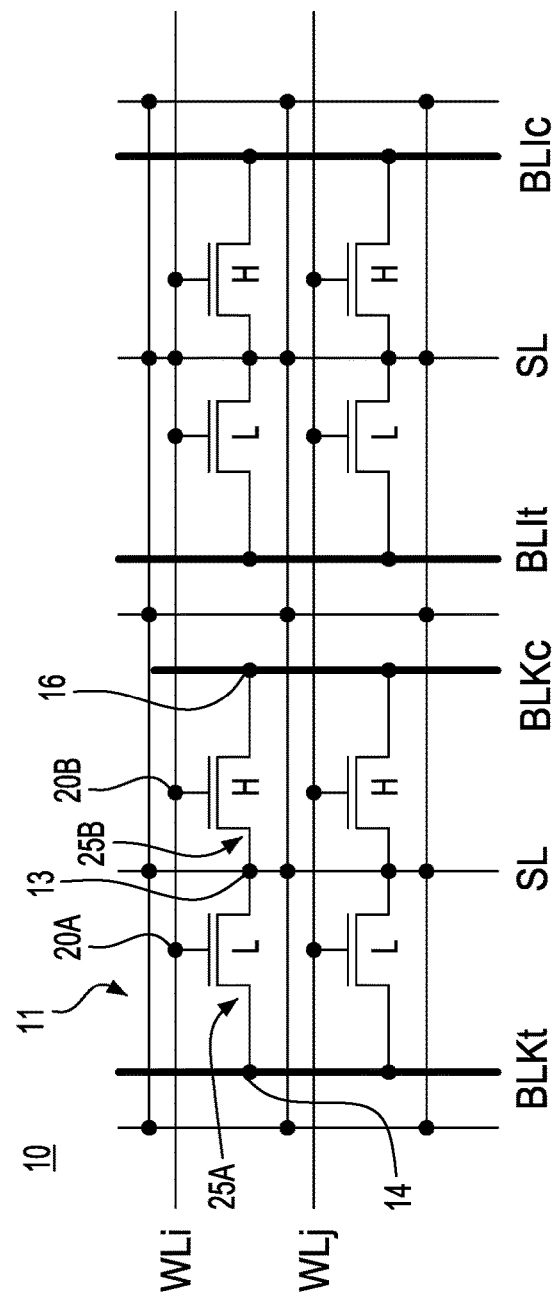
FIG. 2 depicts an existing MTPM Twin Cell memory structure programmed with a default state.
Figure 3:
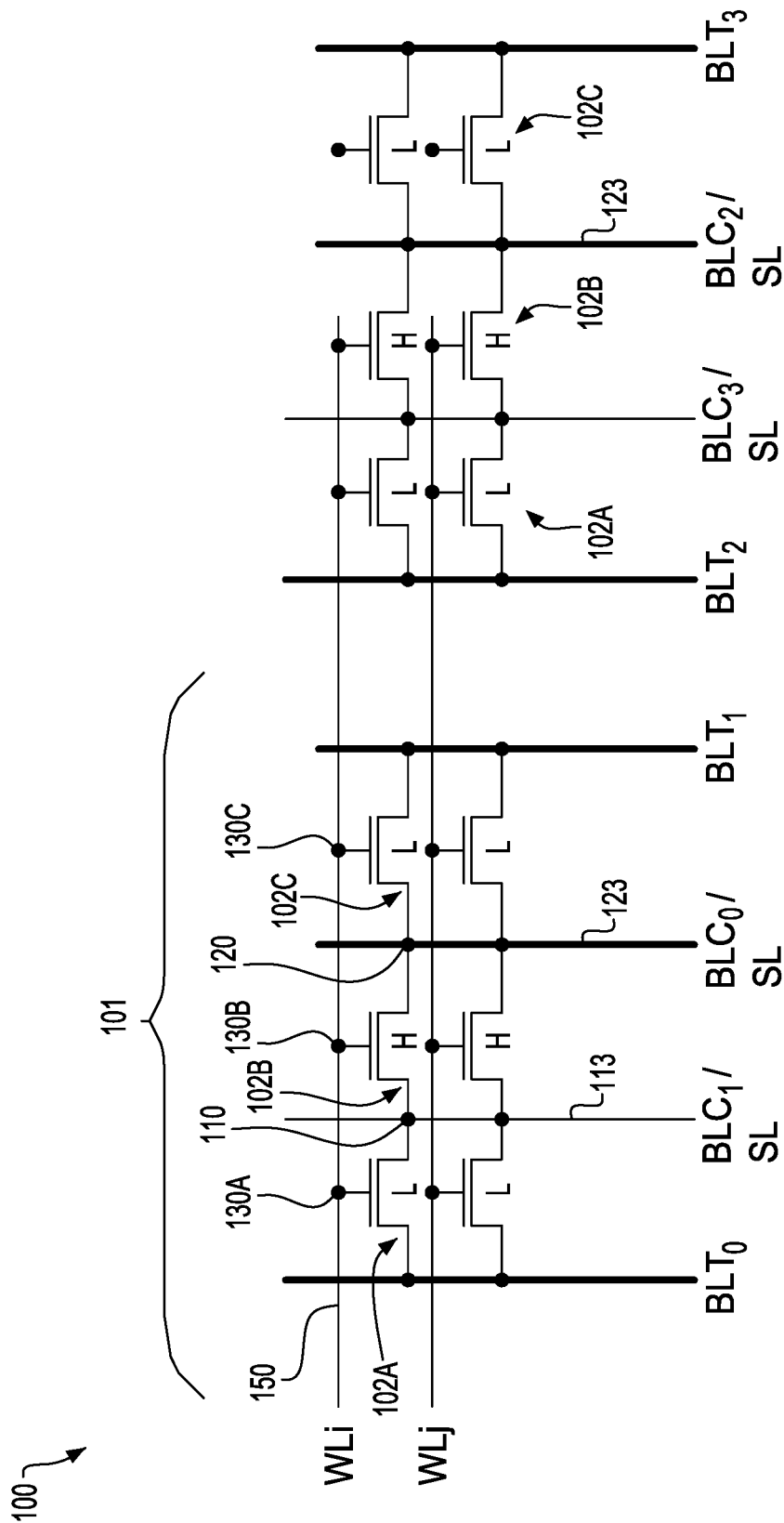
FIG. 3 depicts an MTPM Cell memory structure 100 according to one embodiment that includes a tri-transistor (3T) memory cell having connected first transistor 102A, second transistor 102B, and third transistor 102C.

FIG. 3 shows a memory cell array architecture 100 in which three transistors are programmed for storing 2 bits of information, each bit comprising a Bitline True and Bitline Complement voltages, i.e., each utilizing 1.5 transistors per bit.

In FIG. 3, each of the plurality of tri-transistor (3T) memory cells 101 include first transistor 102A, second transistor 102B, and third transistor 102C. First transistor 102A has a first terminal, e.g., FET drain terminal, connected with a Bitline conductor, such as a bitline True of a first storage bit ($BLT_0$), and a further terminal, e.g., source terminal, connected with a further bitline conductor such as a bitline Complement of a second storage bit ($BLC_1$). Second transistor 102B has a first terminal, e.g., FET drain terminal, connected with the Bitline conductor, such as the bitline Complement of the first storage bit ($BLC_1$), and a further terminal, e.g., source terminal, connected with a further bitline conductor such as a bitline Complement of the first storage bit ($BLC_0$). Thus, first and second transistors 102A, 102B have common node 110 coupling to a bitline conductor $BLC_1$. and which functions also as source line 113 (SL) running vertically and coupling to other cells in the same column in the array. Third transistor 102C has a first terminal, e.g., FET drain terminal, connected with a Bitline Complement conductor of the first storage bit ($BLC_0$), and a further terminal, e.g., source terminal, connected with a further bitline conductor such as bitline True of the second storage bit ($BLC_1$). Thus, second and third transistors 102B, 102C have common node 120 coupling to a bitline conductor $BLC_0$ and which also functions as source line 123 (SL) running vertically and coupling to other cells in the same column in the array.

The tri-transistor (3T) cell 101 architecture of the MTPM array 100 shown in FIG. 3 further includes three gate electrodes 130A, 130B and 130C respectively of the respective transistors 102A, 102B and 102C which are connected to a common wordline (WL) conductor 150, running horizontally, and coupling to other cells in a same row in the array 100. For example, for row i of array 100, the tri-cell transistor electrodes 130A-130C connect to Wordline WLi, and for row j, the tri-transistor cell gate electrodes connect to Wordline WLj.

In the embodiment of FIG. 3 depicted, two of the three transistors are used to effectively store each bit value, For example, transistor 102A and transistor 102B effectively stores a first bit value and transistor 102C and the transistor 102B effectively storing a second bit value for that cell 101. Here, each second transistor 102B is shared equally with respect to first and second storage bits of the cell 101. The transistor 102B acts like a local reference for both 102A and 102C transistors. In this embodiment, the three transistors may each be configured with a threshold voltage Vt state to achieve default bit state value, e.g., ones or zeros, which avoids the need for extra programming cycles to achieve when in operation.

In one embodiment, the cell 101 is configured in a default state, e.g., each transistor having a predetermined threshold voltage Vt value. For example, in the embodiment shown, transistor 102A has a Vt or initial value LVT (low threshold voltage), and the second transistor, e.g., device 102B exhibits a higher threshold voltage state HVT; and the third transistor device 102C exhibits a LVT state. In one embodiment, the LVT states of the first and third transistors may be the same and may range between about 0.2V to 0.25V. Typical HVT, may range from about 0.35V to 0.45V.

In this embodiment shown, for example, LVT transistor 102A and HVT transistor 102B effectively stores a zero ("0") bit value as the default first bit state; and LVT transistor 102C and the HVT transistor 102B effectively stores a zero ("0") bit value as the default second bit state for cell 101. Here, transistor 102B is shared equally with respect to first and second storage bits of the cell 101.

Thus, the configuration of connected LVT-HVT-LVT devices stores two bits of information. Further, this also provides default states for the two bits similar to an electrical fuse. To store the opposite two bit values, LVT device cells are programmed to an extent such that its threshold voltage shifts above the HVT transistor's Vt. Thus, HVT transistor device acts as a localized reference for both the LVT transistors in this 3-Transistor (3-T) cell.

Figure 4:
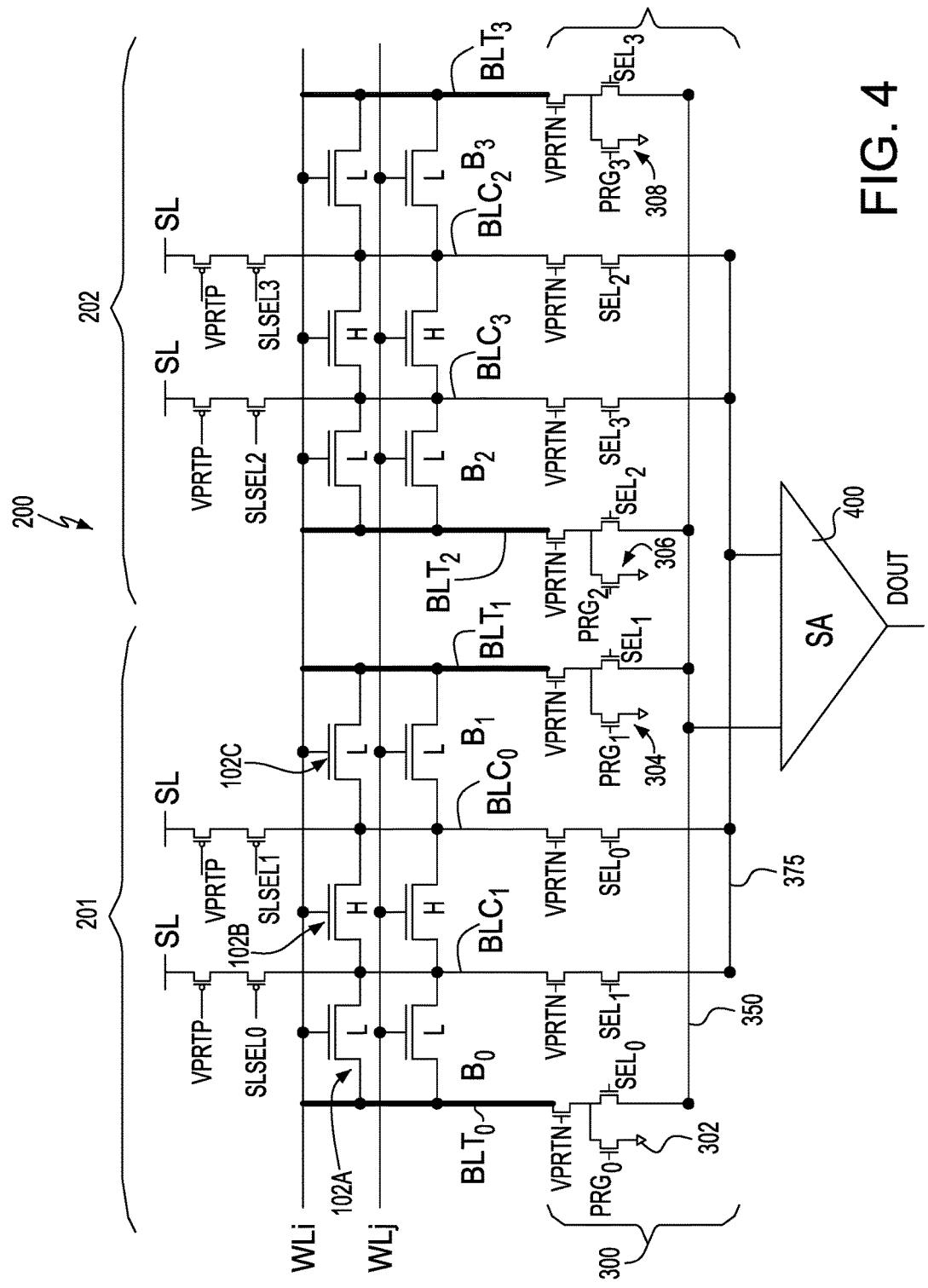
FIG. 4 shows a further cell array 200 configured with a 4×1 column multiplexor device 300 according to an embodiment.

FIG. 4 shows a further cell array 200 configured with a 4×1 column multiplexor device 300. As shown in FIG. 4, two 3T cell structures 201, 202 are configured to store four information bits B0, B1, B2 and B3. Bit B0 being accessible via connected bitline pairs BLT-0 and BLC0, bit B1 being accessible via connected bitline pairs BLT-1 and a corresponding BLC-1; bit B2 being accessible via connected bitline pairs BLT-2 and a corresponding BLC-2; and bit B3 being accessible via connected bitline pairs BLT-3 and a corresponding BLC-3. Based on a selected wordline WL and a selected matched bitline truth and complement pair, these bitline pair values are multiplexed by multiplexor device 300 to a sense amplifier 400 for a read operation.

In the embodiment depicted, when functioning as source lines, conductor BLC0 of cell 201 is connected at one end to a voltage source SL via select transistors SLSEL1 and VPRTP transistor. Similarly, conductor BLC1 of cell 201 VPRTP transistor. Similarly, conductor BLC1 of cell 201 transistor is connected at one end to a voltage source SL via select transistors SLSEL0 and VPRTP transistor. The transistors shown having applied VPRTP voltage signal and VPRTN voltage signal connected to the respective gates are used as protect devices.

The bitline conductor BLT0 for first storage bit B0 is taken to 0V during programming via a signal at a gate of program transistor 302 when selected in conjunction with activating connected protect VPRTN transistor at BLT 0. Bitline conductor BLT0 of cell 201 is further connected as a first input to multiplexed line 350 of a 4×1 multiplexer device 300 as a selected input to a sense amplifier 400 via connected protect transistor VPRTN and a select transistor SEL0.

Further in the embodiment depicted, when functioning as bitline conductors for programming bit values to or reading stored bit values from the cell, conductor BLC1 of cell 201 is connected at the other end as a first connection to multiplexed line 375 of the 4×1 multiplexer 300 as a selected input to a sense amplifier 400 via connected select transistors SEL1 and VPRTN transistor. Similarly, when functioning as bitline conductors for programming bit values to or reading stored bit values from the cell, conductor BLC0 of cell 201 is connected at the other end as a second connection to multiplexed line 375 of the 4×1 multiplexer 300 as a selected input to a sense amplifier 400 via connected select transistors SEL0 and VPRTN transistor.

The bitline conductor for second storage bit B1 is taken to 0V during programming via a signal at a gate of program transistor 304 when selected in conjunction with activating connected protect transistor VPRTN at BLT 1. Bitline conductor BLT1 of cell 201 is further connected as a second connection to multiplexed line 350 of the 4×1 multiplexer 300 and selectable as an input to a sense amplifier 400 via connected protect transistor VPRTN and a select transistor SEL1.

In the embodiment bitline pairs BLT0/BLC0, BLT1/BLC1, BLT2/BLC2 and BLT3/BLC3 are accessible for selection via 4×1 multiplexor device 300. For sensing, only a single bitline pair of a single cell, e.g., BLT0/BLC0 of cell 201, are accessible simultaneously for sensing.

Continuing to the second cell 202 of FIG. 4, the bitline conductor for third storage bit B2 is taken to 0V during programming via a signal at a gate of program transistor 306 when selected in conjunction with activating connected protect transistor VPRTN at BLT 2. Bitline conductor BLT2 of cell 202 is further connected as a third connection to multiplexed line 350 of the 4×1 multiplexer 300 and selectable as an input to a sense amplifier 400 via connected protect transistor VPRTN and a select transistor SEL2.

In the embodiment depicted, when functioning as source lines, conductor BLC3 of cell 202 is connected at one end to a voltage source SL via select transistors SLSEL2 and VPRTP protect transistor. Similarly, conductor BLC2 of cell 202 transistor is connected at one end to a voltage source SL via select transistors SLSEL3 and VPRTP transistor.

Further in the embodiment depicted, when functioning as bitline conductors for programming bit values to or reading stored bit values from the cell, conductor BLC3 of cell 202 is connected at the other end as a third connection to multiplexed line 375 of the 4×1 multiplexer 300 as a selected input to a sense amplifier 400 via connected select transistors SEL3 and VPRTN transistor. Similarly, when functioning as bitline conductors for programming bit values to or reading stored bit values from the cell, conductor BLC2 of cell 202 is connected at the other end as a fourth connection to multiplexed line 375 of the 4×1 multiplexer 300 as a selected input to a sense amplifier 400 via connected select transistors SEL2 and VPRTN protect transistor.

The bitline conductor for fourth storage bit B3 is taken to 0V during programming via a signal at a gate of program transistor 308 when selected in conjunction with activating connected protect transistor VPRTN transistor at BLT3. Bitline conductor BLT3 of cell 202 is further connected as a fourth connection to multiplexed line 350 of the 4×1 multiplexer 300 and selectable as an input to a sense amplifier 400 via connected protect transistor VPRTN and a select transistor SEL3.

In particular, in the embodiment depicted, asserting select signal SEL0 enables multiplexor (mux) 300 to output a stored bit at truth and complementary bitline pair BLT0/BLC0 for sensing by sense amplifier 400 via respective multiplexor lines 350/375; similarly, by asserting select signal SEL1 enables mux 300 to output a stored bit at truth and complementary bitline pair BLT1/BLC1 for sensing by sense amplifier 400 via respective multiplexor lines 350/375. Similarly, by asserting select signal SEL2 enables mux 300 to output a stored bit at truth and complementary bitline pair BLT2/BLC2 for sensing by sense amplifier 400 via respective multiplexor lines 350/375; and by asserting select signal SEL3 enables mux 300 to output a stored bit at truth and complementary bitline pair BLT3/BLC3 for sensing by sense amplifier 400 via respective multiplexor lines 350/375.

It should be understood that the particular embodiments depicted in FIG. 4 is exemplary and an N-column multiplexor may be implemented for storing N 3T cells array.

Thus, the 3T-cell architecture for storing two data bits has advantages compared to the OBA (single transistor/bit) and Twin-Cell (two transistors/bit) architectures: including having a programmable default state, an adequate sensing margin that improves upon the OBA 1T/Bit cell design, and presents more options for reference cell tuning for improving sensing margin at sense amplifier. Moreover, a measure of a number of Lines (Bit+Source)—indicative of cell routing complexity—is 2 lines per bit which is more than OBA but less than twin-cell designs FIG. 5 shows a table 500 depicting Dual Bit 3T MTPROM array voltage conditions for writing (programming), reading and erasing modes of operation for cells of the array 100.

In table 500, in a program mode of operation a bit value is written to 3T cell: bitcells 200 connected a particular wordline, e.g., wordline WLi, i=1, . . . , N. Thus, 3T cells of a selected wordline are written to by first setting WLi high, e.g., to approximately 2.0 V. Unselected 3T cells connected to further wordlines WLj remain unactivated, e.g., WLj is set to 0 V, j≠i.

Figure 5:
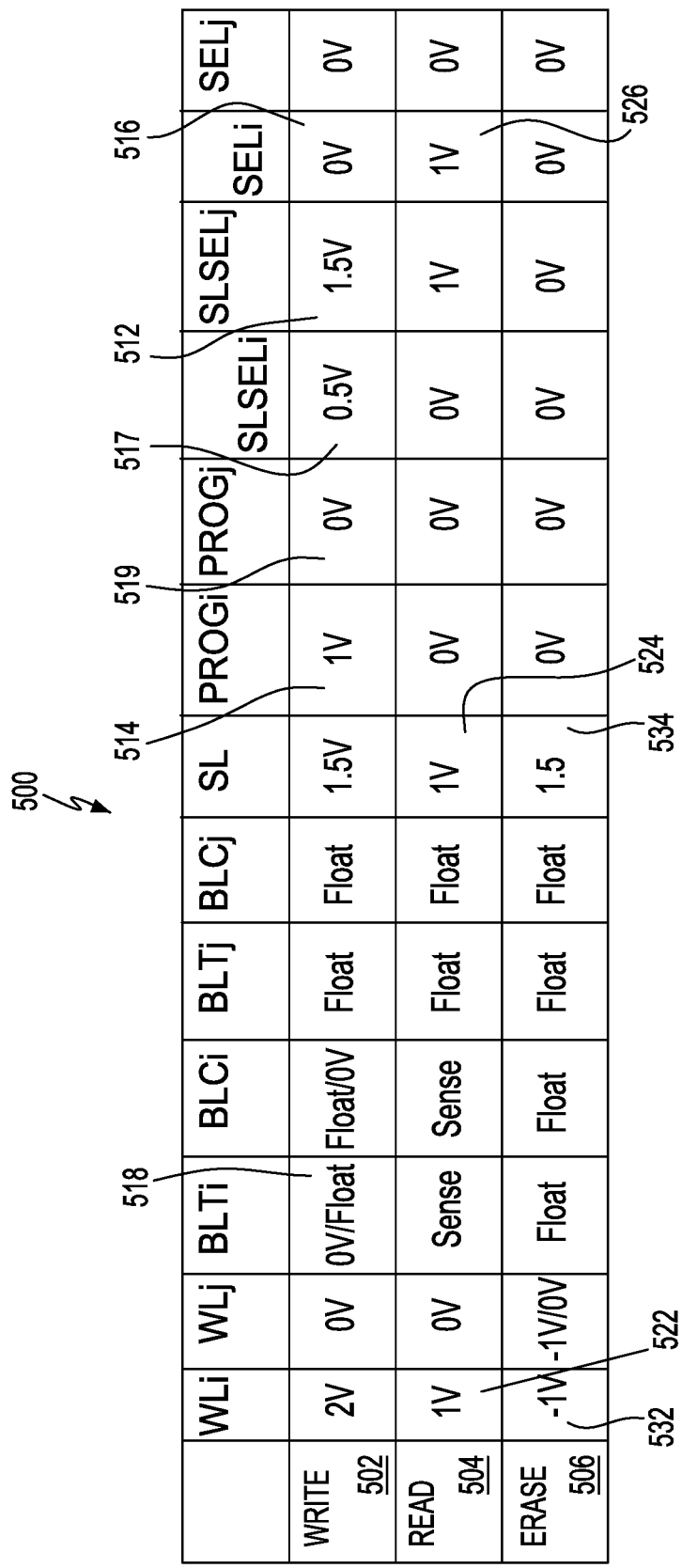
FIG. 5 shows a table 500 depicting signal values for conducting write, read or erase operations for the MTPM Cell memory structure 100.

A write operation 502 to program a value for bit i, wherein i=0, i.e., bit 0, is now described with respect to the table 500 in FIG. 5 and memory circuit 200 of FIG. 4. When writing a bit to memory cell storage using transistors 102A, 102B, 102C the voltage at SL 113 for BLC1/SL is raised to 1.5V and transistors are enabled to apply the SL voltage by asserting SLSELi signal by raising its gate voltage to 0.5 volts at 517. BLT0 is programmed to a native 0 bit value by raising the prog_i signal to 1 V at 514 while bitline select transistor is off, i.e., SEL_i (i=0) is at 0 V at 516. Thus, BLT0 is programmed at 0V at 518 while BLC0 is floating. Additionally, remaining bitcell pairs of unselected cells BLT j and BLC j are at a floating state. This is due to effect of SLSEL j being set to 1.5 V at 512 and signal prog_j set at 0V at 519 while SEL_j is at 0 V.

A sense operation 504 to read a value for bit 0, e.g., bit i=bit 0, is now described with respect to the table 500 in FIG. 5 and circuit of FIG. 4. To read out the bit stored in the cell using transistors 102A, 102B, 102C the voltages at BLT0 and BLC0 are sensed by sense amplifier 400. Here, the wordline voltage WL0 is lowered at 522 to about 1.0 V as compared to the WL voltage during write operation. Further, at 524, source voltage SL 113 for BLC1/SL is lowered to 1.0 V as compared to the SL voltage during a write operation. To enable multiplexing of the BLT0 and BLC 0 voltages bit 0 via multiplexor 400, SEL0 is asserted by raising its (bitline select) voltage to 1V at 526 thus enabling multiplexing action for amplifier 400 to sense BLT0 at line 350 and BLC0 at line 375. While SEL_j signal is 0V, remaining bitlines are unselected, i.e., bitcell pairs BLT j and BLC j remain at a floating state.

An erase operation 506 to reset the cell value for a bit 0, e.g., bit i=bit 0, is also described with respect to the table 500 in FIG. 5 and circuit of FIG. 4. When erasing a stored bit value using transistors 102A, 102B, 102C the voltages at BLT0 and BLC0 are set to a floating state by bringing the wordline voltage WL0 lower to −1 V at 532 while the source line SL 113 is raised to about 1.5 V at 534.

The MTP cell and array configuration such as shown in FIGS. 3 and 4 improves non-volatile memory area density improves by about 25%. The configuration of three transistors used in L-H-L configuration for storing 2 bits of information saves one transistor per two bits yet retains the programming margin of the twin cell. However, it is better than the single transistor approach in terms of programming margin.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A memory system comprising:
   a multi-time programmable (MTP) bit cell array, with each multi-time programmable bit cell of the array comprising:
      a first FET transistor and a second FET transistor having a first common connection, and the second FET Transistor and a third FET transistor having a second common connection, the first and second connected FET transistors programmable to store a first bit value, and the second FET transistor and the third connected FET transistors programmable to store a second bit value, wherein the first FET transistor exhibits a low threshold voltage on value (LVT), the second FET transistor exhibits an elevated threshold voltage value (HVT) and the third FET transistor exhibits a native threshold value LVT lower than HVT, wherein each MTP bit cell further comprises:
         a first terminal of the first FET transistor connecting with a first bit line (True) (BLT0) conductor coupled via a first column write switch device;
         a second terminal of the third FET transistor connecting with a second bit line (True) (BLT1) conductor coupled via a fourth column write switch device;
         the second common connection formed of a second terminal of the second FET transistor and a first terminal of the third FET transistor, a third switch device for selectively connecting the second common connection to a first complement bitline conductor (BLC0), and a further switch for selectively connecting the second common connection to a supply voltage source via a first source line (SL) conductor;
         the first common connection formed of a second terminal of the first FET transistor and a first terminal of the second FET transistor, and a second switch device for selectively connecting the first common connection to a second complement bitline conductor (BLC1), and a further switch connecting the first common connection to the supply voltage source via a second source line conductor;
   a wordline conductor (WL) programmable for activating MTP bit memory cell, each of the first, second and third FET transistors of each the MTP bit memory cell including a respective gate terminal for connection with the wordline conductor (WL) element;
   a sense amplifier for sensing received signals;
   a multiplexor for selecting one out of many data output signals, the multiplexor responsive to control signals for activating the first switch device and third switch device to enable sensing, by the sensing amplifier, of voltage values representing a first stored information bit on the first bit line (True) conductor and first complement bit line conductor, or responsive to control signals for activating the second switch and fourth switch devices to enable sensing, by the sensing amplifier, of voltage values representing a second stored information bit on the second bit line (True) conductor and second complement bit line conductor.

2. The system of claim 1, wherein said first bit and second bits each have a default first value to be stored in the cell, each first and second bit being separately programmable to store an opposite bit values by raising a threshold value of the LVT transistors higher than the threshold value of the HVT.

3. A method of operating a multi-time programmable (MTP) bit cell comprising:
   selecting a MTP bit cell to write an initial bit value for storage at the selected bit cell, the MTP bit memory cell comprising:
      a first FET transistor and a second FET transistor having a first common connection, and said second FET transistor and a third FET transistor having a second common connection, said first and second connected FET transistors programmable to store a first bit value, and said second FET and said third connected FET transistors programmable to store a second bit value, wherein said first FET transistor exhibits a low threshold voltage (LVT), said second FET transistor exhibits an elevated threshold voltage value (HVT) and said third FET transistor exhibits a low threshold value LVT lower than HVT,
      wherein, a first terminal of said first FET transistor connects with a first bit line (True) conductor coupled via a first column write switch device,
      a second terminal of said third FET transistor connects with a second bit line (True) conductor coupled via a fourth column write switch device;
      the second common connection is formed of a connection between a second terminal of the second FET transistor and a first terminal of the third FET transistor, a third switch device for selectively connecting the second common connection to a first complement bitline conductor; and
      the first common connection is formed of a connection between a second terminal of the first FET transistor and a first terminal of the second FET transistor, and a second switch device for selectively connecting the first common connection to a second complement bitline conductor; and
      a further switch device for selectively connecting the second common connection to a supply voltage source via a first source line (SL) conductor, said supply voltage source for biasing said second common connection when writing to said first storage bit in said first FET transistor and second FET transistor; and
   writing a first bit of information for storage at the first FET transistor and second FET transistors of said selected MTP cell by:
      activating said further switch for biasing said second common connection using said SL supply voltage source; and
      activating a program switch device for switching connection of a program bit voltage supply on the first bit line (True) conductor while said first column write switch device de-activated; and
      applying at the first bit line (True) conductor, using the program bit voltage supply, a program voltage to said first FET transistor and second FET transistor devices for storage of a bit value thereat.

4. The method of claim 3, wherein each of the first, second and third FET transistors of each said MTP bit memory cell includes a respective gate terminal for connection with a wordline conductor (WL) element configured for activating said cell, said selecting comprising:

asserting a signal at said WL conductor for accessing said MTP cell.

5. The method of claim 4, wherein the MTP bit cell further comprises:
- a further switch connecting the first common connection to the supply voltage source via a second source line conductor, said supply voltage source for biasing said first common connection when writing to a second bit value in said second FET transistor and said third FET transistor;
- wherein the writing of the second bit value for storage at the second FET transistor and third FET transistor of said selected MTP cell comprises:
  - activating said further switch for biasing said first common connection using said SL supply voltage source; and
  - activating a program switch device for switching connection of a program bit voltage supply on the second bit line (True) conductor while said fourth column write switch device de-activated; and
  - applying at the second bit line (True) conductor, using the program bit voltage supply, a program voltage to said second FET transistor and third FET transistor device for storage of a bit value thereat.

6. The method of claim 5, further comprising:
reading, using a sense amplifier, a first bit of information from said MTP bit memory cell by:
- activating said first column switch device for switching connection of the stored program bit on the first bit line (True) conductor while said program switch device is deactivated; and
- simultaneously activating the third switch for selectively connecting said second common connection to the first complement bitline conductor,
- said sense amplifier reading a stored first programmed bit via said first bit line (True) conductor and said first complement bitline conductor.

7. The method of claim 5, further comprising:
reading, using a sense amplifier, a second bit of information from said MTP bit memory cell by:
- activating said fourth switch for switching connection of the stored program bit on the second bit line (True) conductor while said program switch device is deactivated; and
- simultaneously activating the second switch device for selectively connecting said first common connection to the second complement bitline conductor,
- said sense amplifier reading a stored second programmed bit via said second bit line (True) conductor and said second complement bitline conductor.

8. The method of claim 5, wherein said first bit and second bits each have a default first value to be stored in the cell, each first and second bit being separately programmable to store an opposite bit values by raising a threshold value of one of the LVT transistors higher than the threshold value of the HVT for the particular bit.

* * * * *